(12) United States Patent
Lee et al.

(10) Patent No.: US 7,539,059 B2
(45) Date of Patent: May 26, 2009

(54) SELECTIVE BIT LINE PRECHARGING IN NON VOLATILE MEMORY

(75) Inventors: June Lee, San Jose, CA (US); Daniel Elmhurst, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 47 days.

(21) Appl. No.: 11/618,637

(22) Filed: Dec. 29, 2006

(65) Prior Publication Data

US 2008/0159005 A1 Jul. 3, 2008

(51) Int. Cl.
  *G11C 11/34* (2006.01)
  *G11C 7/00* (2006.01)
  *G11C 16/06* (2006.01)
(52) U.S. Cl. .......................... 365/185.21; 365/185.03; 365/185.18; 365/185.25; 365/203
(58) Field of Classification Search ............ 365/185.21, 365/185.25, 185.03, 185.18, 203
See application file for complete search history.

(56) References Cited

U.S. PATENT DOCUMENTS 6,058,042 A * 5/2000 Nobukata .............. 365/185.03
7,088,615 B2 * 8/2006 Guterman et al. ...... 365/185.03
7,369,437 B2 * 5/2008 Kamei ................... 365/185.17
7,460,406 B2 * 12/2008 Mokhlesi et al. ....... 365/185.21

OTHER PUBLICATIONS

Byeon, Dae-Seok, et al., "An 8Gb Multi-Level NAND Flash Memory with 63nm STI CMOS Process Technology", *2005 IEEE International Solid-State Circuits Conference*, (Feb. 7, 2005), 46-47.

Hara, Takahiko, et al., "A 146-mm² 8-Gb Multi-Level NAND Flash Memory with 70-nm CMOS Technology", *IEEE Journal of Solid-State Circuits*, vol. 41, No. 1, (Jan. 2006), 161-169.

Lee, June, "A 90-nm CMOS 1.8-V 2-Gb NAND Flash Memory for Mass Storage Applications", *IEEE Journal of Solid-State Circuits*, vol. 38, No. 11, (Nov. 2003), 1934-1942.

* cited by examiner

*Primary Examiner*—Ly D Pham
(74) *Attorney, Agent, or Firm*—Schwegman, Lundberg & Woessner, P.A.

(57) ABSTRACT

A flash memory device, such as a NAND flash, is described having an array of floating gate transistor memory cells with strings of memory cells connected to respective bitlines. Structures and methods for selectively pre-charging bitlines are described.

18 Claims, 11 Drawing Sheets

SELECTIVE BIT LINE PRECHARGING IN NON VOLATILE MEMORY

FIELD OF THE INVENTION

The present invention relates to non-volatile memory devices and, more particularly, to bitline charging in non-volatile memory.

BACKGROUND

Flash memory is non-volatile, which means that it stores information on a semiconductor in a way that does not need power to maintain the information in the chip. Flash memory is based on the Floating-Gate Avalanche-Injection Metal Oxide Semiconductor (FAMOS transistor), which is essentially a Complimentary Metal Oxide Semiconductor (CMOS) Field Effect Transistor (FET) with an additional conductor suspended between the gate and source/drain terminals. Current flash memory devices are made in two forms: NOR flash and NAND flash. The names refer to the type of logic used in the storage cell array. Further, flash memory stores information in an array of transistors, called "cells", each of which traditionally stores one or more bits of information.

A flash cell is similar to a standard MOSFET transistor, except that it has two gates instead of just one. One gate is the control gate like in other MOS transistors, but the second is a floating gate that is insulated all around by an oxide layer. The floating gate is between the control gate and the substrate. Because the field gate is isolated by its insulating oxide layer, any electrons placed on it get trapped there and thus store the information.

When electrons are trapped on the field gate, they modify (partially cancel out) an electric field coming from the control gate, which modifies the threshold voltage (Vt) of the cell. Thus, when the cell is "read" by placing a specific voltage on the control gate, electrical current will either flow or not flow between the cell's source and drain connections, depending on the Vt of the cell. This presence or absence of current is sensed and translated into 1's and 0's, reproducing the stored data.

One application of non volatile memory is portable devices. Conservation of electrical power is desired in portable devices. Moreover, non volatile memory can be slower to operate than volatile memory. It is desired to speed operation of flash memory.

DESCRIPTION

In the following detailed description of the invention, reference is made to the accompanying drawings which form a part hereof, and in which is shown, by way of illustration, different embodiments in which the invention may be practiced. These embodiments are described in sufficient detail to enable those skilled in the art to practice the invention. Other embodiments may be utilized and structural, logical, and electrical changes may be made without departing from the scope of the present invention.

According to various embodiments, each transistor or floating gate transistor memory cell is described as being activated or switched on when it is rendered conductive by a voltage on its gate that exceeds its threshold voltage Vt, and the transistor or floating gate transistor memory cell is described as being in an inactive state or switched off when the voltage on its gate is below the threshold voltage Vt and the transistor or floating gate transistor memory cell is non-conductive.

According to various embodiments, signals are applied to control the states of switches, e.g., transistors. A signal may be inverted in some instances to control the conductivity of a switch that is of the opposite type, e.g., a PMOS may be substituted for an NMOS.

All timing diagrams illustrated and described herein show at least one of voltages or signals versus time t.

Figure 1:
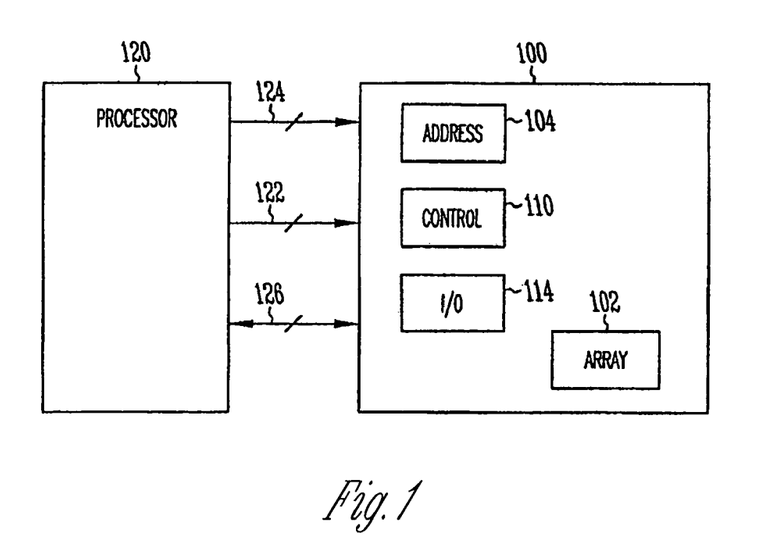
FIG. 1 is a simplified block diagram of an integrated circuit dynamic memory device in accordance with an embodiment of the invention.

FIG. 1 is a simplified block diagram of an integrated circuit dynamic memory device 100 in accordance with an embodiment of the invention. The memory device 100 includes an array of non-volatile floating gate memory cells 102, address circuitry 104, control circuitry 110, and input/output (I/O) circuitry 114. The memory cells are also referred to as flash memory cells because blocks of memory cells are erased concurrently in a flash operation.

The memory device 100 can be coupled to a processor 120 or other memory controller for accessing the memory array 102. The memory device 100 coupled to a processor 120 forms part of an electronic system. Some examples of electronic systems include personal computers, peripheral devices, wireless devices, mobile telephones, digital cameras, personal digital assistants (PDA's), digital audio players, and audio recorders.

The memory device 100 receives control signals across control lines 122 from the processor 120 to control access to the memory array 102 via control circuitry 110. Access to the memory array 102 is directed to one or more target memory cells in response to address signals received across address lines 124. Once the array is accessed in response to the control signals and the address signals, data is written to or read from the memory cells across data, DQ, lines 126.

It will be appreciated by those skilled in the art that additional circuitry and control signals can be provided, and that the memory device of FIG. 1 has been simplified to help focus on the invention. It will be understood that the above description of a memory device is intended to provide a general understanding of the memory and is not a complete description of all the elements and features of a typical memory device.

Flash memory is nonvolatile memory that can be erased and reprogrammed in units of memory called blocks. A write operation in any flash device can only be performed on an empty/erased unit, so in most cases an erase operation must precede the write operation.

Figure 2:
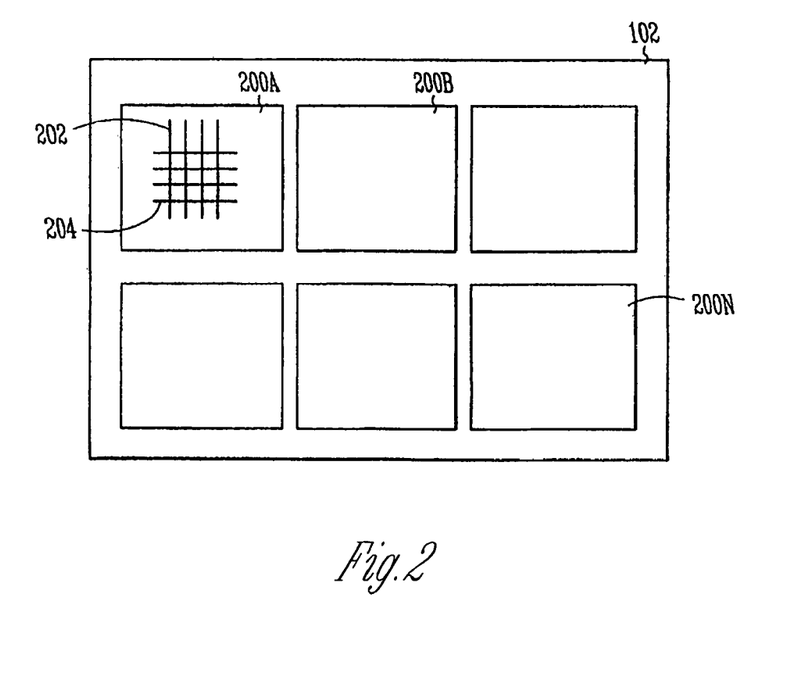
FIG. 2 illustrates a block diagram of a memory device array according to an embodiment of the invention.

FIG. 2 is a simplified block diagram of an example array 102 having a plurality of array erase blocks 200a-200n. The size and number of erase blocks are not relevant to the present invention. Further, the erase blocks may not be physically separate, but can be defined by erase operations. In one embodiment, the memory includes at least 2000 blocks.

Each erase block includes memory cells arranged generally in columns 202 and rows 204. The rows of cells are coupled to word line conductors and the columns are coupled to bit line conductors.

The memory array may be organized as follows. A number of cells are connected in series with access transistors to form a string. One bit line contact is provided for two strings, sometimes defined as an even string and an odd string. The strings are organized into pages. A wordline connection addresses two pages that are joined to a single bitline connection. A block includes $2^N$ pages. These values can be scaled for different sized memory, e.g., 2, 4, 8, 16 gigabyte memories. For example, in a two gigabyte memory, 32 cells form one string. One page may include 2,064 bytes formed from the strings. One block consists of 64 pages or 32 wordline connections.

Figure 3:
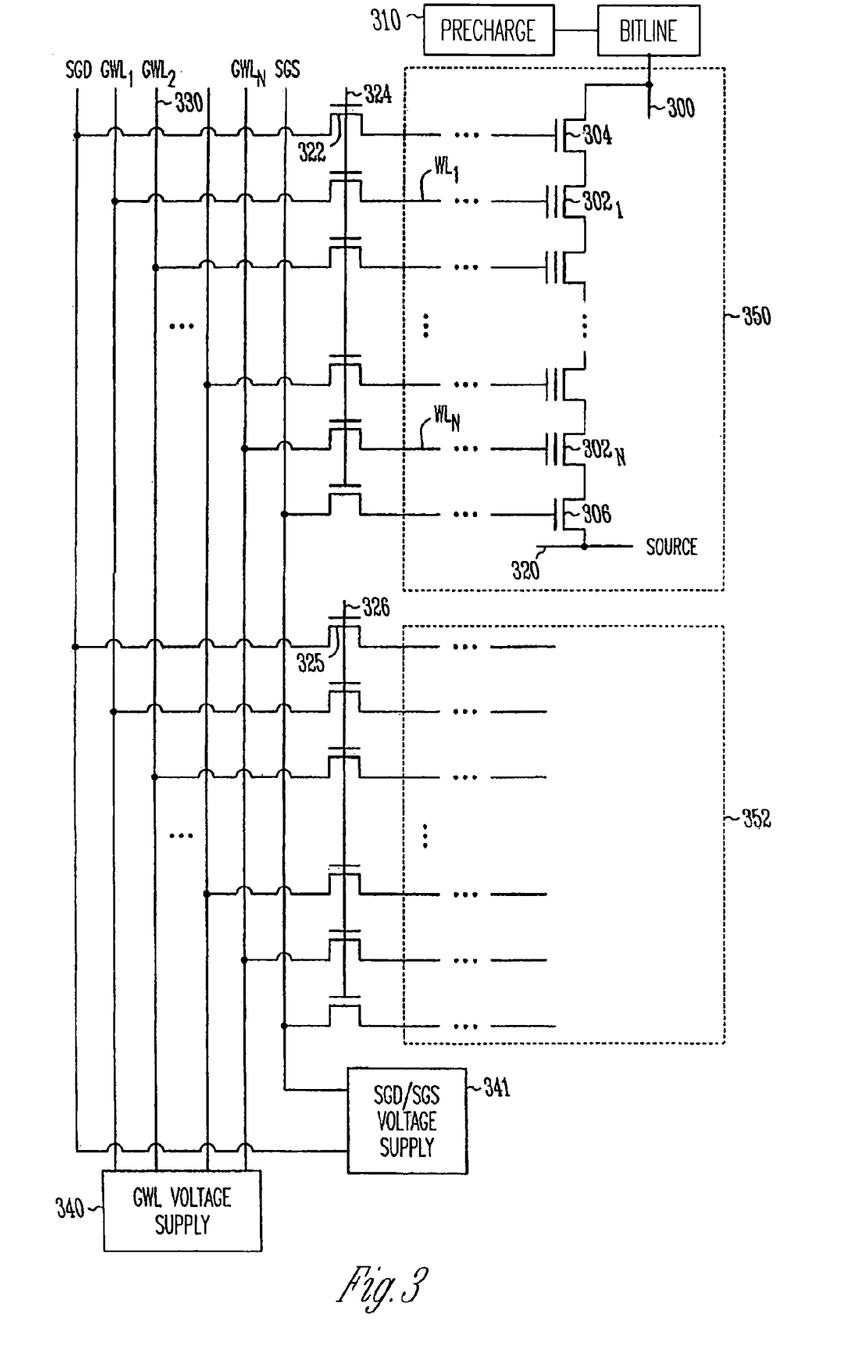
FIG. 3 is a partial schematic diagram of a non volatile, NAND flash array according to an embodiment of the invention.

FIG. 3 illustrates a simplified portion of a NAND flash memory of the present invention. For simplicity, two array blocks 350 and 352 are illustrated. For purposes of explaining operation of the memory block, 350 is referred to herein as being a selected block because a memory cell in that block is selected for programming. Block 352 is referred to herein as being an unselected block because it does not contain the memory cell selected for programming.

In block 350, a bit line 300 is coupled to a series of non-volatile floating gate transistor memory cells $302_1$-$302_n$ via drain select transistor 304. The series of memory cells $302_1$-$302_n$ can be referred to as a string. The bit line 300 is coupled to a precharge circuit 310, which provides a selected charge level on the bit line. The precharge circuit 310 draws current from a current source, e.g., a power rail that supplies Vcc and Icc, to set a select voltage on the bit line. The precharge circuit 310 may further operate as a page buffer circuit as will be described herein. The memory cells are coupled to a source line 320 via a source select transistor 306. Control gates of the memory cells are coupled to word lines ($WL_1$-$WL_n$).

Each word line can be selectively coupled to one of a plurality of Global Word Lines (GWL) 330 through a driver transistor 322. Each GWL is coupled to receive voltages from a voltage supply 340. A voltage supply 341 is coupled to provide a gate voltage to the drain select transistor 304 and the source select transistor 306.

During operation, the gate 324 of driver transistors 322 of block 350 are controlled to couple all of the word lines of a NAND group of memory cells to selected voltage levels. The term Global Word Lines (GWL) refers to the hierarchical structure of word line conductors. As such, the GWL's are used to provide signals to multiple word lines of the array.

Block 352, and any other unselected blocks in the array, are coupled to a word line pre-charge voltage through driver transistors 325 and a respective driver gate signal on gate 326.

In a read operation, a word line, for example $WL_1$ of a target (selected) memory cell $302_1$, is maintained at a low voltage level. All unselected cell word lines are ($WL_2$-$WL_n$) are coupled to a voltage sufficiently high to activate the unselected cells regardless of their floating gate charge. If the selected cell $302_1$ has an uncharged floating gate, it is activated. The bit line 300 and source line 320 are then coupled through the series of memory cells. If the selected cell $302_1$ has a charged floating gate it will not activate. The bit line 300 and source line 320, therefore, are not coupled through the series of memory cells.

In program operations word lines in unselected array blocks, such as block 352, of the memory array are coupled to zero volts. Unselected refers to array blocks not containing the memory cell(s) being programmed. The word lines in a selected array block are coupled to either a program voltage (Vpgm) or an intermediate voltage (Vpass). The Vpgm is coupled to the word line of the memory cell selected to be programmed and the Vpass is coupled to all of the unselected word lines of the selected block. For example, the Vpgm and Vpass voltages are about 10 volts and 20 volts, respectively, for 3.3 volt NAND memory devices.

In embodiments of the present invention, word lines of selected and unselected blocks are pre-charged to a low level, such as one volt. The pre-charge voltage can be coupled through the GWLs 330 and driver transistors 322 and 325, or a secondary biasing circuit. Further, the pre-charge operation can be limited to the unselected blocks in some embodiments.

Figure 4:
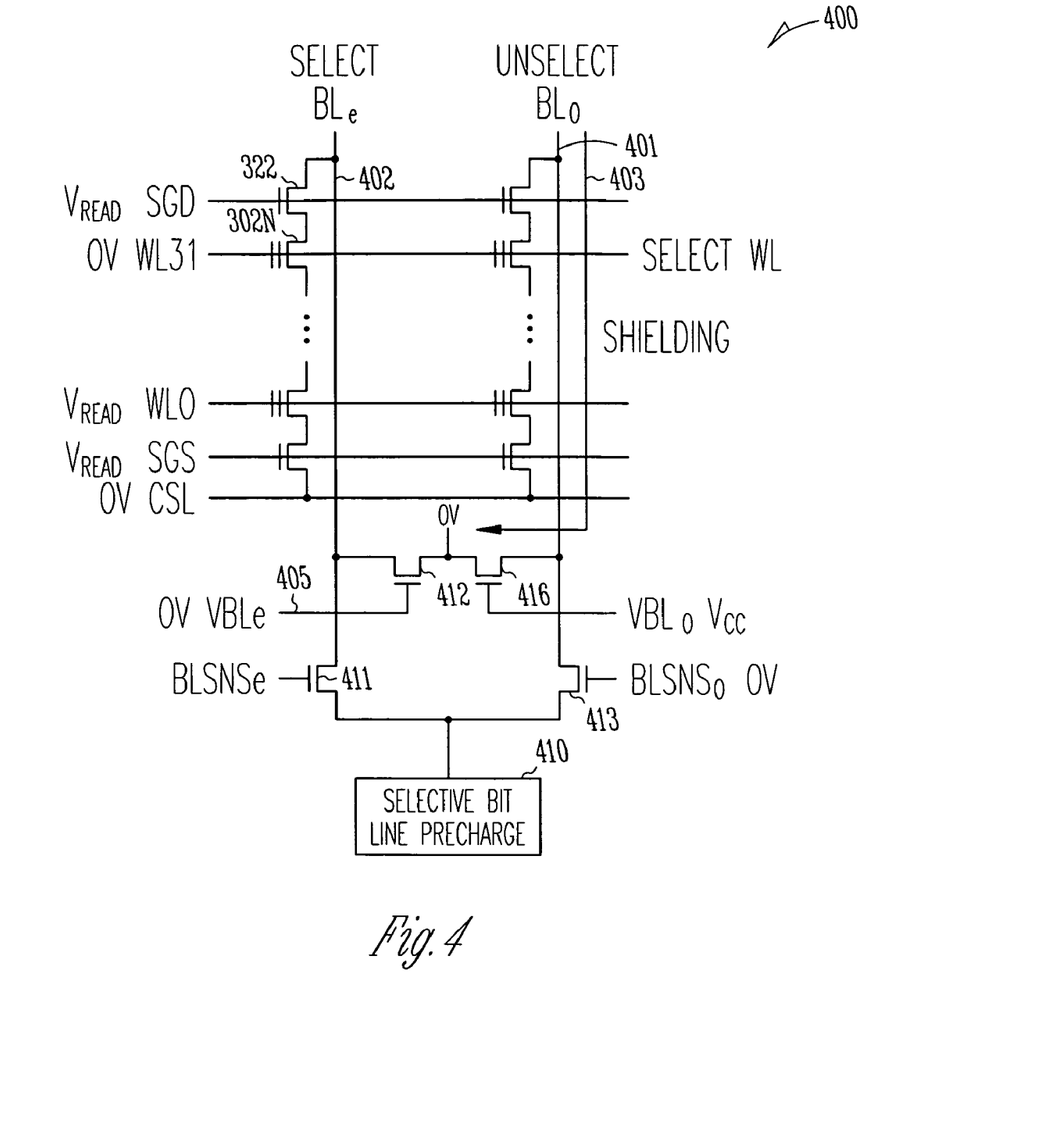
FIG. 4 is schematic diagram of a block of a non volatile, NAND flash array according to an embodiment of the invention.

Referring to FIG. 4, a schematic view 400 of a non-volatile memory architecture including two NAND strings connected to a single bit line contact. The two NAND strings are logical constructs with an odd bitline 401 and an even bitline 402. With the designation of an even bitline and an odd bitline, these can be addresses with a simple binary flag, for example, a most significant bit in an address. Shielding 403 is provided to prevent coupling between adjacent bitlines that may resulting sensing errors. Shielding 403 is set to ground or zero volts. As the odd/even pair of bit strings are connected to a same bitline contact there is provided a 2-1 multiplexing circuit 405 that connects the bitline pair 401, 402 to a selective precharge circuit 410.

A read or sensing operation of the FIG. 4 embodiment will now be described. One of the bitlines 402 is selected by energizing the bitline through the bitline select even (BL-SNSe) being energized such that the even bitline 402 is energized by the selective bitline precharge circuit 410. Transistor or switch 411 receives signal BLSNSe on its gate, which is set high in an embodiment. The signal VBLe is set to ground so that transistor or switch 411 is not conductive. The odd bitline 401 is set to ground grounding the gate of the bitline select odd (BLSNSo) so that the associated transistor or switch 413 is not conductive. The signal VBLo is set to Vcc so that transistor or switch 416 is conducting and connects bitline odd 401 to ground. In a read operation, the source gate drain (SGD) signal for transistor 322 is set to a read voltage. The source gate source (SGS) signal for transistor 322 is set to a read voltage. The unselected memory cell transistors also receive the read voltage at their gates. In the illustrated embodiment, the transistor being read is the transistor $302_N$ connected to wordline WL31, which is set to zero volts for an initial reading of the multilevel cell $302_N$. Typically, all selected bitlines are precharged globally. However, in some instances precharging of some bitline is not needed. Accordingly, the selective bitline precharge 410 operates to only precharge those bitlines that require precharging to thus reduce power consumption. The programmed status of the transistor $302_N$ is determined according to methods described herein.

Figure 5:
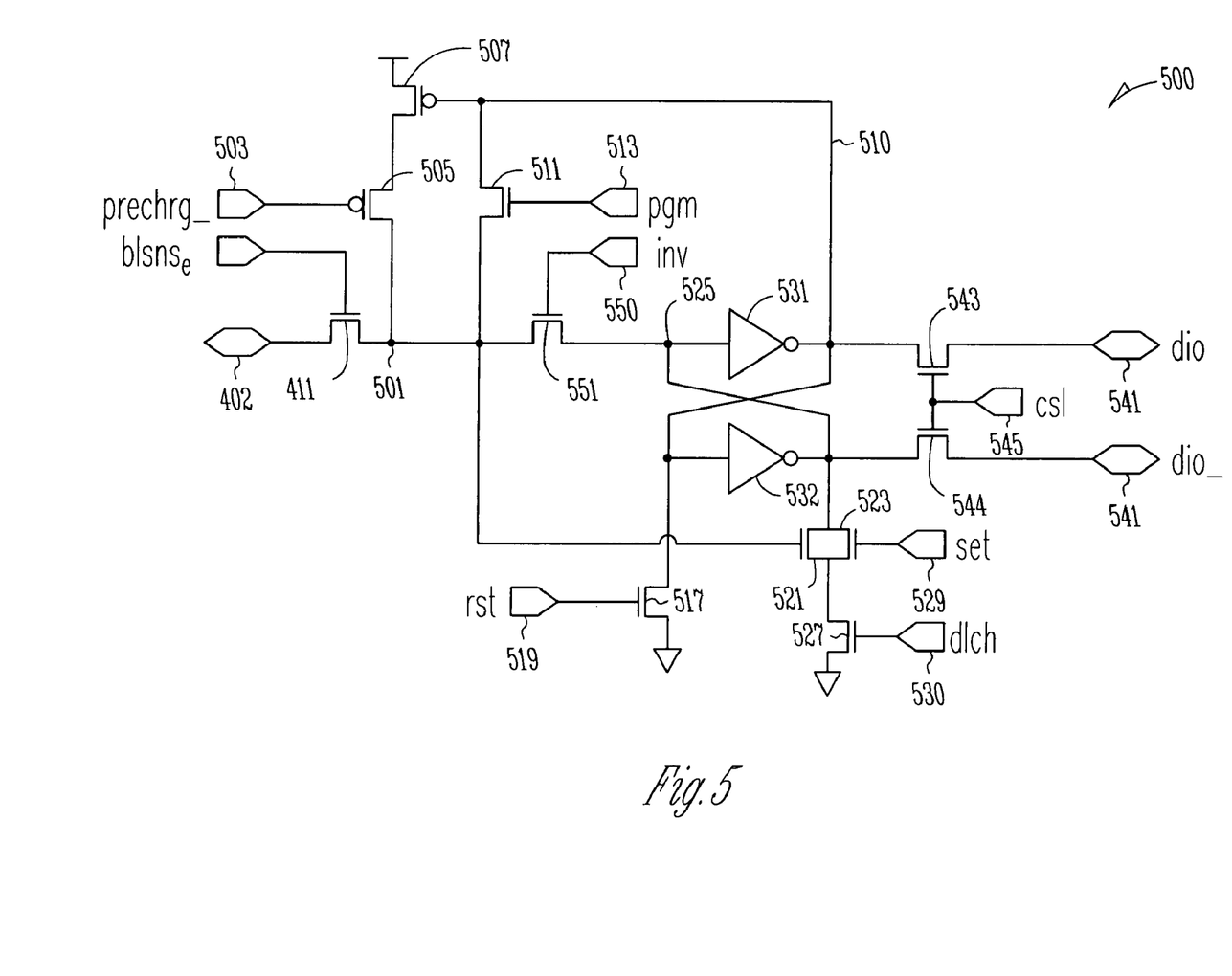
FIG. 5 illustrates a schematic diagram of page buffer for a NAND flash array according to an embodiment of the invention.

FIG. 5 shows an embodiment of a selective bitline precharge circuit 500. Circuit 500 includes a node 501 that is connected to the transistor 411, which is controlled by the BLSNSe signal at its gate. The contact 402 represents the NAND string of multilevel cell transistors 302 as described above and is connected to the other source/drain of transistor 411. A precharge signal source with an active low is provided at node 503 and connected to the gate of PMOS transistor 505. One source/drain of transistor 505 is connected to node 501. A power rail PMOS transistor 507 connects a power rail, e.g., Vcc, to one source/drain of PMOS transistor 505. The gate of transistor 507 is connected to node 510. A transistor 511 has a first source/drain connected to node 510 and a second source/drain connected to node 501. The gate of transistor 511 is controlled by a program signal source 513. A reset transistor 517 connects ground to node 510 and is controlled by a reset signal source 519. A transistor 521 is connected in parallel with transistor 523, with a first source/drain of each being connected to node 525 and a second source/drain of each being connected to a source/drain of transistor 527. The gate of transistor 521 is connected to node 501. The gate of transistor 523 is connected to a set signal source 529. The other source/drain of transistor 527 is connected to a low voltage source, e.g., ground. The gate of transistor 527 is connected to a data latch signal source 530. A first inverter 531 connects node 525 to node 510. A second inverter 532 connects node 510 to node 525. Data input 541 and data inverse input 542 are connected to nodes 510 and 525, respectively, each through control transistor 543, 544 that are controlled by a column select signal source 545. A data inverse signal source 550 is connected to a gate of a transistor 551 that connects the node 525 to node 501 to selectively invert the data at nodes 510 and 525. Operation of this selective bitline precharge circuit will be explained in greater detail herein.

It will be appreciated that circuit 500 is simplified to clearly illustrate embodiments of the present invention. Circuit 500 will perform single level cell page buffering. However, for full multilevel cell functionality additional elements to perform program and program verify.

Figure 6A:
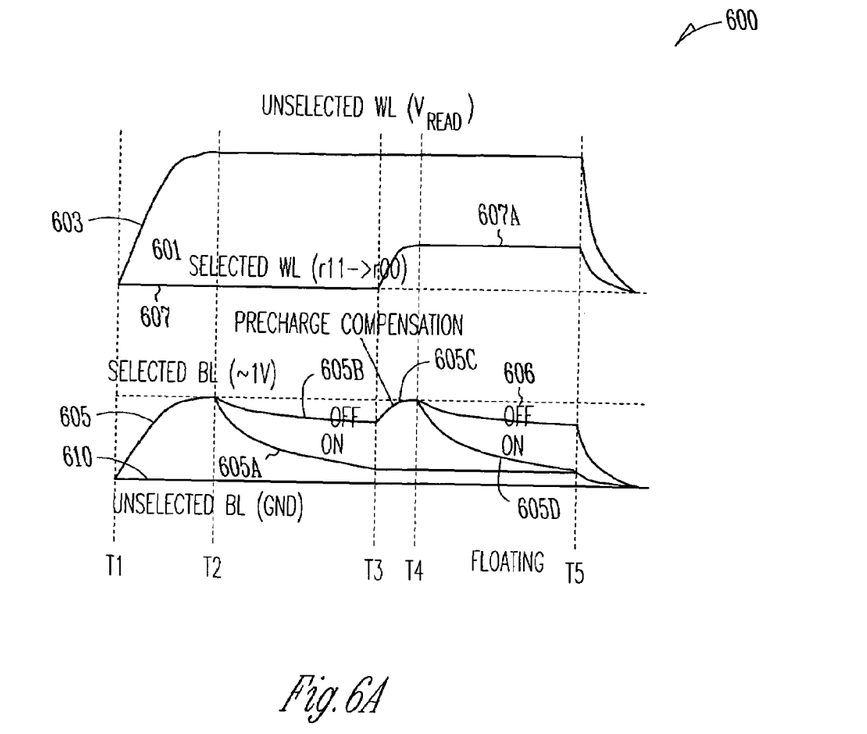
FIG. 6A is a timing diagram of an example operation of a non volatile memory according to an embodiment of the invention.

FIG. 6A shows a timing diagram 600 of a precharge compensation scheme. It is decided to read a selected cell in a NAND string at time T1. During time 601 between T1 and T2, the unselected wordlines 603 are powered to a read voltage level and the selected bitline 605 are precharged to a bitline precharge level 606. In an example, the bitline precharge is set to about one volt. The unselected bitlines 610 are set to ground. The selected wordline 607 is held at a first sense voltage to determine a first program level in the selected cell to time T3. At time T2 the selected bitline 605 is fully charged and sensing begins. The selected bitline 605 dicharges 605A if the selected memory cell, activated by selected wordline 607 and selected bitline 605, is the first program level. Specifically, the selected memory cell is "on", i.e., conducting. In this case the cell level is known to be in the lowest level. The selected bitline 605A is then allowed to float after sensing as its value is known for both the upper page and the lower page of data stored in the memory cell.

If the selected memory cell remains "off", the selected bitline signal remains at a high level 605B. However, some charge leakage occurs and the voltage level on the bitline is less than the full charge 606. Typical NAND memories, discharge the voltage levels and start the process anew with the selected wordline set at a higher voltage for a subsequent read operation. This other method is time and energy consuming.

In the timing scheme shown at 600, the selected wordline 607 is charged to a higher level 607A beginning at time T3 and achieving full charge at time T4. The selected bitline is selectively precharged or refreshed at the same time, see signal level 605C. If the bitline was not determined to be "on", then the bitline is at level 605, a precharge compensation is applied between time T3 and T4. This occurs at the same time as the selected wordline is being charged to a higher level. Accordingly, a smaller amount of charge is needed to raise the "off" selected wordline 605B to level 606. This also occurs in a shorter time frame than charging the selected bitline from ground to the sensing level 606. In an example, the selective precharge compensation time, i.e., between T3 and T4 is about or less than half the initial precharge time between T1 and T2. In a further example, the selective precharge time is less than about one-third the initial precharge time. At time T4 the selected wordline is now at its raised sensing level 607A, a new sensing period begins. The selected bitline 605 discharges 605D if the selected memory cell, activated by selected wordline 607A and selected bitline 605, is at a second program level. Specifically, the selected memory cell is "on", i.e., conducting. In this case the cell level is known to be at a certain level. In an example, the wordline select level is to determine if the memory cell is below the highest level. If the highest level and the lowest level are set with the same lower page value, then if the elected bitline remains off during the first sensing and on during the second sensing, then the value stored in the memory cell is at the second or third level.

Figure 6B:
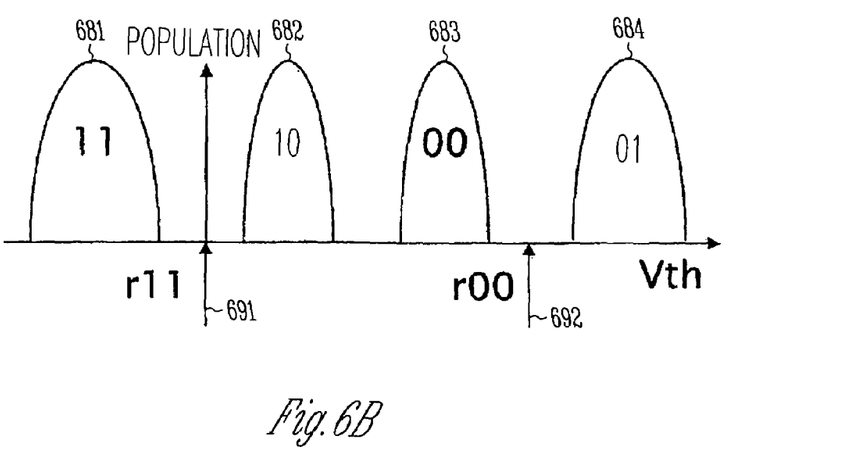
FIG. 6B is a schematic view of programming levels for a non-volatile memory cell.

FIG. 6B shows a population verses threshold voltage for a multilevel, non-volatile memory cell. In the order of ascending threshold voltages there are a first level 681, a second level 682, a third level 683, and a fourth level 684. While it is understood that any of levels 681, 682, 683, and 684 can be programmed to represent any two bits, in the example shown level 681 represents data value or bits "11", level 682 represents data values or bits "01", level 683 represents data values or bits "00", and level 684 represents data values or bits "10". With reference to the embodiment described in reference to FIG. 6A, the first sensing operation occurs with at 691 to determine if the selected multilevel cell is at the first level 681, i.e., an r11 read. Read operation 691 represents the selected wordline at zero volts. The second sensing operation that occurs after a selective precharge, if needed, is at 692, which is the highest voltage for the selected wordline. If the selected bitline does not discharge to an "on" state, then the selected memory cell is programmed to the fourth state 684. If the selected bitline discharges to an "on" state in the second sensing operation, then the multilevel cell is in one of the second level 682 or third level 683. In either event, the lower page bit is determined in these two sensing steps for the data represented by the levels in FIG. 6B.

Figure 7:
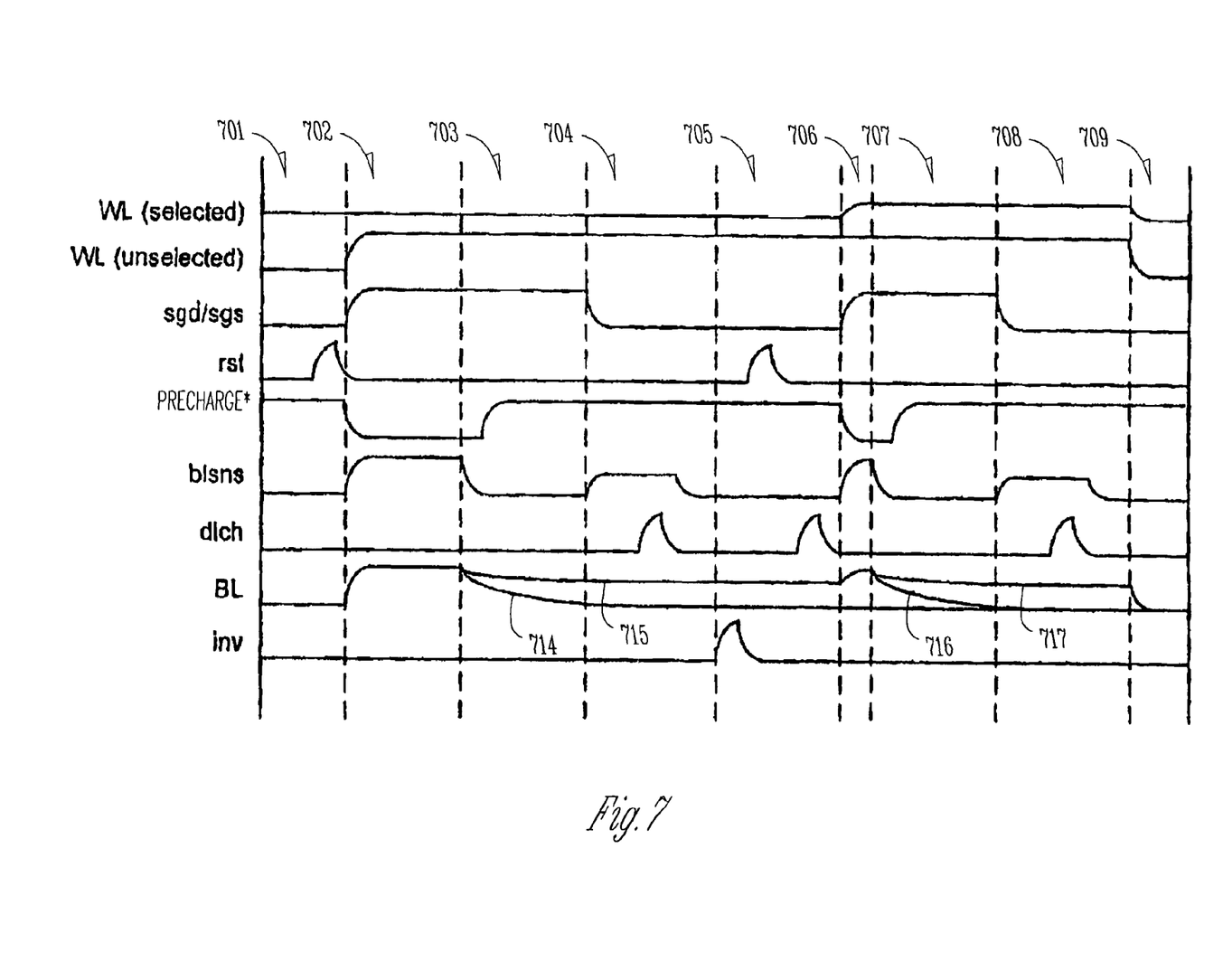
FIG. 7 is a timing diagram of an example operation of a non volatile memory according to an embodiment of the invention.

FIG. 7 shows a further timing diagram 700 that includes the signals that can be applied to the circuit shown in FIG. 5. As an overview, the selective precharge compensation is shown at time 706. The first time period 701 is a reset time period, wherein a reset signal is asserted with the other signals remaining low. This sets both the data node 501 to zero and the inverse data node 525 to one. Second time period 702 precharges the selected bitlines, i.e., those with a zero at node 510, asserting a high bitline sense signal, blsns, and charging the all of the selected bitlines, BL, by applying a low active signal at the precharge source 503. The SGD and SGS signals are asserted high. Also during the second time period the selected wordline remains low and the unselected wordlines are shifted to a high level.

The third time period 703 is a first developing operation at a first sensing level with the bitline sense value selected accordingly. In an example, the sensing level is chosen to be read level 691 as shown in FIG. 6B. Bitline sense is discharged to ground. The unselected wordline and SGD/SGS remain high. The precharge* signal is deasserted by transitioning to high. The bitline BL discharges if the selected memory cell is conductive and the signal at node 501 drops to level 714. If the selected memory cell is not conductive, then the bitline signal remains high or charged 715. However, there is some bitline charge loss due to leakage. Accordingly, signal level 715 is slightly below the fully charged state. At fourth time period 704, the data sensed, i.e., the level of bitline as sensed at node 501, must be latched into a data latch, e.g. nodes 510 and 525 connected to inverters 531, 532 of FIG. 5. SGD and SGS are discharged to ground. A sense voltage level is asserted on bitline sense, blsns. The data latch signal, dlch, is asserted at 530 of FIG. 5. If bitline node 501 remains high 715, then transistor 521 is on and with the data latch signal high, the inverted data node 525 is set to ground. The data node 510 is set to high or one, which turns off the PMOS voltage source transistor 507. The sensed level of the memory cell is now latched at node 510 and the inverted node 525 and can be output on data I/O lines 541, 542.

When the bitline is sensed at level 714, i.e., low, the memory cell programmed level or state is known, e.g., it is the level 681 of FIG. 6B. Accordingly, the bitline need not be charged again. Bitline charging is prevented by the logical high or one signal on node 510 that holds power supply PMOS transistor 507 off regardless of the precharge*signal. Accordingly, the power rail is not connected to the node 501 regardless of the conductive state of transistor 505 and precharge* signal at 503. However, the 10w state of node 501 leaves transistor 521 in an off state. As a result the data on node 510 and inverted node 525 remains the same, here zero and one, respectively. The bitline sense signal is turned off and the node 501 is isolated from the NAND string 402. At time 705, the invert signal 550 is asserted and the high value from inverted node 525 to transferred to node 501. This turns on the transistor 521 Invert signal is turned off. Reset signal 519 is then asserted to set node 510 to zero and inverted node 525 to one. The reset signal is then tuned off. Transistor 507 is now off. Data latch signal 530 is asserted and with transistor 521 on, the inverted node 525 is set to ground and the node 510 is set on with the transistor 521 off. Accordingly, the power source is not connected through transistor 507 and precharge* transistor 505 to the bitline node 501.

When the bitline is sensed at level 715, i.e., high, it can not be determined the level of the programmed, select memory cell other than it is not at a level below the first sense operation. At time period 705, the invert data signal is asserted and activates transistor 551 to transfer the data at inverted node 525 to the bitline node 501. Here the inverted node 525 is low and its low state is transferred to the bitline node 501. As a result the transistor 521 remains off. The value at the inverted node 525 and node 510 remain the same regardless of activation of data latch signal 530. Reset signal 519 is applied to set node 510 to low and the inverted node 525 to high. The power rail PMOS transistor is on again. The data latch signal 530 is asserted high. However, node 501 is low and the transistor 521 is not conducting. As a result the node 510 stays low and the power rail PMOS transistor 507 remains on. Accordingly, further precharging can occur.

At time period 706, the selected wordlines are increased in level. SGD and SGS are charged. The precharge* signal is set low, active. The bitline sense is set high. In the case where the previous bitline was sensed at level 714, no further precharging occurs. However, if the bitline was at the higher level 715, further precharging or refreshing the bitline charge at node 501 occurs through power rail transistor 507 and precharge transistor 505.

A second developing time period 707 occurs, whereat the precharge* signal moves high (off), the bitline sense signal moves off. The signal at bitline node 501 discharges when the selected programmed memory cell is on, 716. The signal remains high if the selected programmed memory cell is on, 717. A data latch time period 708 now occurs and its operation is similar to that described above with regard to time period 704. However, the level be determined is different than time period 704. As a result, this will determine the level of the selected programmed memory cell and latch the data value at nodes 510 and 525 for output to data I/O lines. A further recovery time period 709 is provided, which discharges the bitline and wordline charges.

FIG. 7 shows a method for performing multilevel cell sensing with a selective bitline precharge scheme. Convention sensing uses two separate sensing operations that are separated by a recovery period that fully discharges the wordlines and the bitlines. FIG. 7 is not strictly to scale as the second, third and seventh time periods 702, 703, and 707 are longer than shown relative to the other time periods. However, sixth time period 706 is significantly shorter than the second time period 702 as the time period 706 is merely compensating for the off cell leakage. While shown the same, the ramp or charging time of the SGD and SGS are significantly faster than the wordline.

Figure 8:
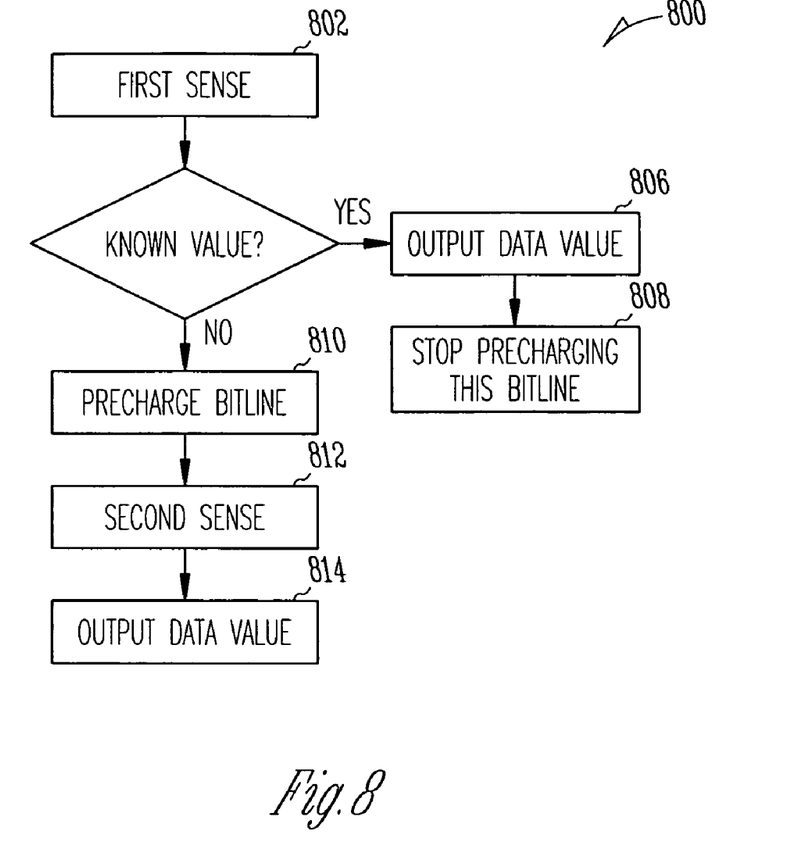
FIG. 8 is flow chart according to an embodiment.

FIG. 8 shows a flow chart 800 according to an embodiment of the present invention. At 802, a first sense operation is performed. At 804, a determination is made whether the sensed bitline value has a known value. That is, based on the signal at the bitline can an accurate determination be made as to the level of the selected programmed memory cell. If yes, the data value is output at 806. At 808, further precharging of this bitline is prevented. If the bitline does not return a known value, then the bitline is selectively precharged at 810. At 812, a second sense operation is performed which will determine the programmed level of the selected memory cell value. At 814, the data value is then output.

Figure 9A:
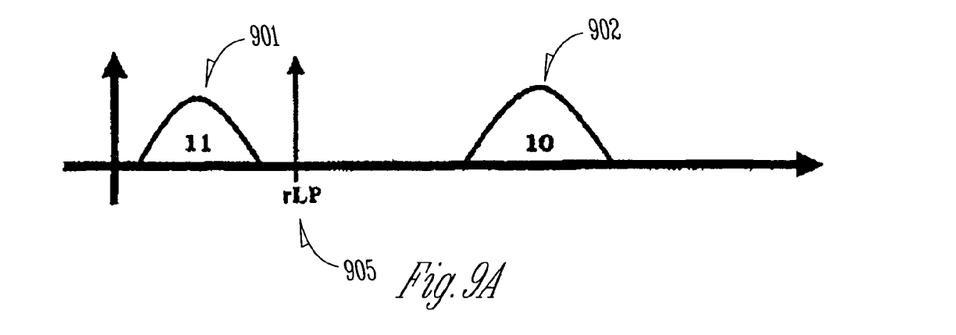
FIGS. 9A and 9B are a schematic view of programming levels for a non-volatile memory cell.
Figure 9B:
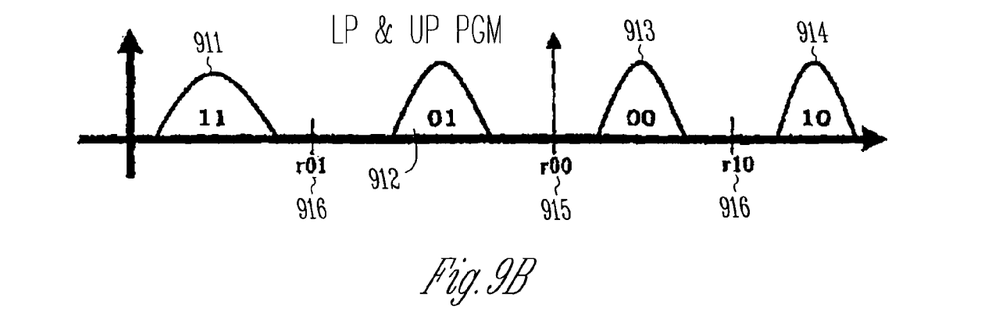

FIGS. 9A and 9B show programming levels for non-volatile memory cells. In an example, the memory cells are NAND flash memory cells. FIG. 9A shows a first level 901 and a second level 902. The second level is at a higher voltage level than the first level 901. The levels 901, 902 can represent a single level non-volatile cell. The levels 901, 902 can also present a one page of a multilevel cell. With only two states or levels, 901, 902 a single sense/read operation 905 is performed to distinguish between the levels 901, 902 to determine the data stored in the memory cell. In one example, levels 901, 902 represent a single programmed page of a lower page of data with level 901 equal to data value "1" and level 902 equal to data value "0." If this represents a multilevel cell, then the upper page will be set to a single value, for example data value "1." This is the illustrated example shown in FIG. 9A where level 901 is data value "11" and level 902 is data value "10."

FIG. 9B shows a plurality of programming levels for a multilevel cell. Here are shown, in order of ascending voltage, a first level 911, a second level 912, a third level 913, and a fourth level 914. Each level represents a different two-bit data value with the least significant bit being a value on a lower page and the most significant bit being a value on an upper page. In the illustrated example, level 911 represents the data value "11", level 912 represents the data value "01", level 913 represents the data value "00", and level 914 represents the data value "10." It will be appreciated that the data values can be assigned to different levels as desired for different applications. In order to determine the level and, hence, the data value of the multilevel cell, three sense/read operations 915, 916, and 917 are performed.

Figure 10A:
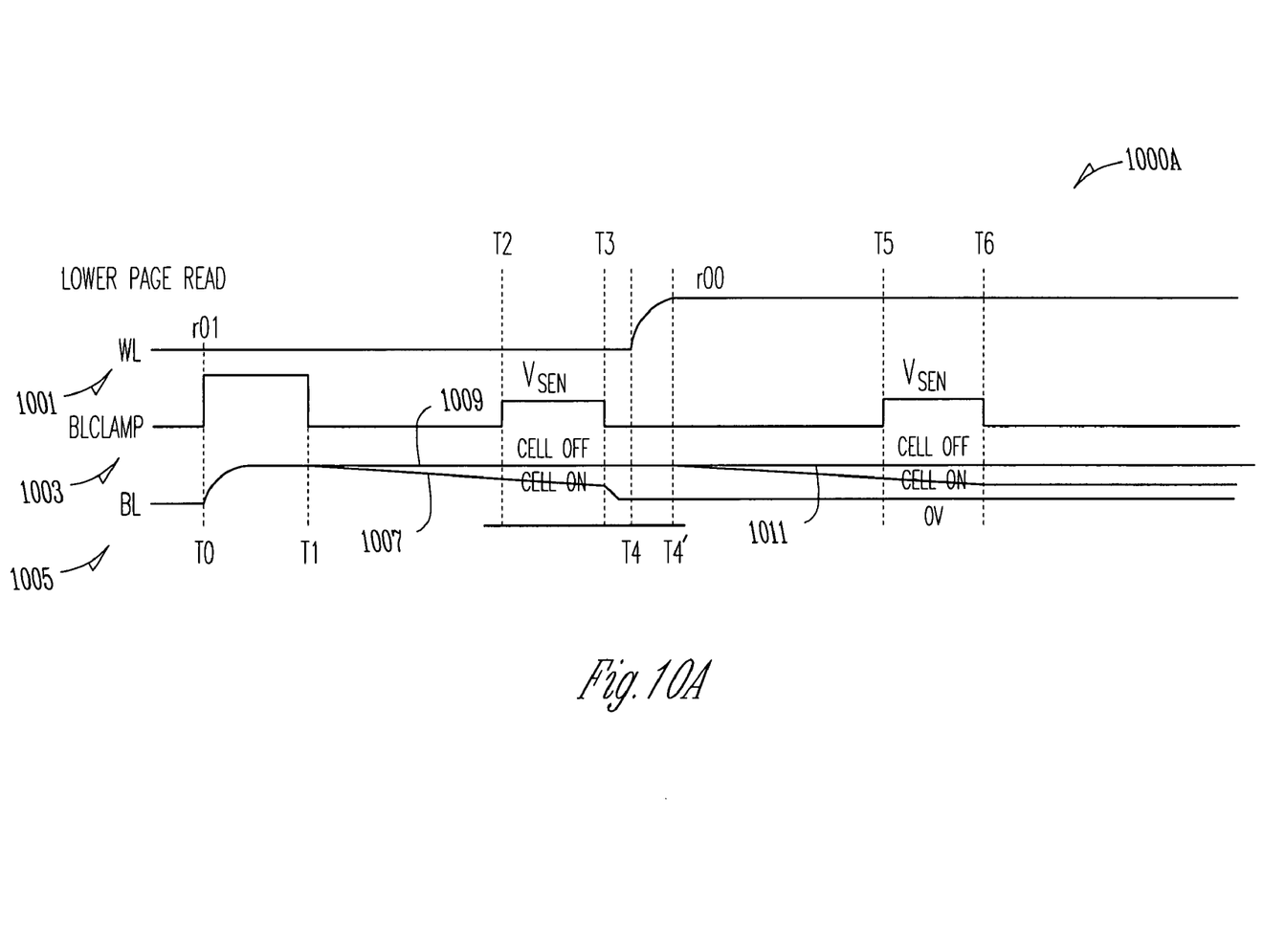
FIGS. 10A and 10B are timing diagram of an example operation of a non volatile memory according to an embodiment of the invention.
Figure 10B:
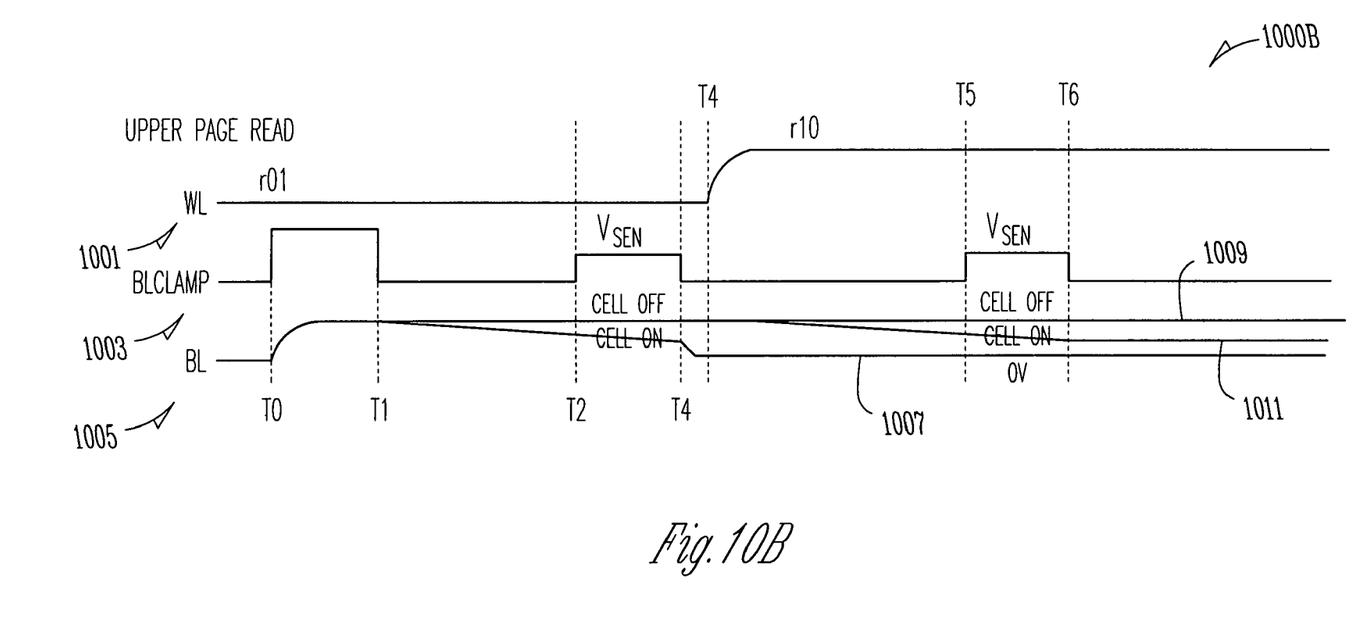

FIGS. 10A and 10B show lower page read operation 1000A and an upper page read operation 1000B, respectively. The first read step of the read operation for both operations 1000A and 1000B are essentially the same. In an example, this first step determines whether the memory cell is programmed to the first level. If so, then the value for both the upper page and the lower page is known. The wordline 1001 is set at a low state, e.g., zero volts, at the start of a read operation. The bitline clamp 1003 shifts from low to high at time T0. The bitline clamp provides a voltage source, e.g., Vcc or current source Icc, to the bitline. The bitline 1005 begins to charge. After the bitline 1005 is fully charged, the bitline clamp is turned off at time T1. At this time if the memory cell is "on" (i.e., the cell is conductive) it begins to discharge the bitline as shown by signal line 1007. If the memory cell is not on, then the bitline remains high as shown by signal line 1009. At time T2, a sense voltage is placed on the bitline clamp 1003. If the signal on the bitline 1005 is above the value of the sense voltage on the bitline clamp, then the memory cell is determined to be off and the corresponding level is higher than the sense value. If the signal on the bitline 1005 is below the value of the sense voltage on the bitline clamp, then the memory cell is determined to be on and the corresponding level is lower than the sense value. If the signal on bitline 1005 is lower than the sense voltage, then the bitline quickly discharges to zero volts after the sense voltage on bitline clamp 1003 transitions low at time T3. Referring back to FIGS. 9A and 9B, this first step in the read operation can correspond to read operation 905 or read operation 916. The read operations 1000A and 1000B on a multilevel cell now diverge in operation for a lower page, operation 1000A, and an upper page, operation 1000B.

Now a second read step is performed. The lower page read operation 1000A at time T4 transitions the wordline 1001 to a high value. When the wordline 1001 is fully transitioned to its high state, then the bitline 1005 will either remain at its state from the first read operation or change state. The bitline state can be zero volts (signal 1007) if the first read operation indicated that the cell was at the first level and hence "on" during the first read step. The state can remain at the high level (signal 1009) indicating that the cell is "off." With the cell "off" the bitline signal 1005 remains at the high level through time T5 and T6, during which the bitline clamp 1003 is set to a sense voltage. When the bitline remains at high level 1009 then the level of the multilevel cell is higher than the test value or the sense voltage. If the bitline begins to discharge along 1011, then the cell is "on" and the level of the cell is lower than the test value or the sense voltage. Referring again to FIG. 9B, the first read step corresponds to read 916. The second read step corresponds to read 915. Here the first read step will determine if the multilevel cell is programmed at the first level 911. The second read step will determine if the multilevel cell is programmed at the second level 912, which corresponds to signal 1011 of FIG. 10A. Bitline signal 1005 remains at level 1009 during the second read step, then the programmed level is either the third level or fourth level, which have the same lower page data value of "0." As a result a lower page value is determined in at most a two-step read operation with a single bitline charge.

In multilevel cells, it is desirable to program the lower levels first. If it is known that the upper page is not programmed, then the lower page read operation need not perform the second step of the lower page read.

The upper page read operation 1000B at time T4 transitions the wordline 1001 to a high value, which in an example, is a higher voltage value than the transition of operation 1000A. The second step in the upper page read operation 1000B is similar to the second step of the lower page read operation except for the higher wordline voltage. Accordingly, some details are left out for clarity. The second step of the upper page read is used to distinguish between different data values in the upper page. Referring again to FIG. 9B, the first read step corresponds to read 916. The second read step of the upper page read corresponds to read 916. Here the first read step of the upper page read will determine if the multilevel cell is programmed at the first level 911. The second read step of the upper page read will determine if the multilevel cell is programmed at the fourth level 914, which corresponds to signal 1011 of FIG. 10B. Bitline signal 1005 remains at level 1009 during the second read step of the upper page read, then the programmed level is either intermediate levels, i.e., the second level 912 or third level 913, which have the same upper page data value of "0." As a result, an upper page value is determined in a two-step read operation with a single bitline charge.

Figure 11:
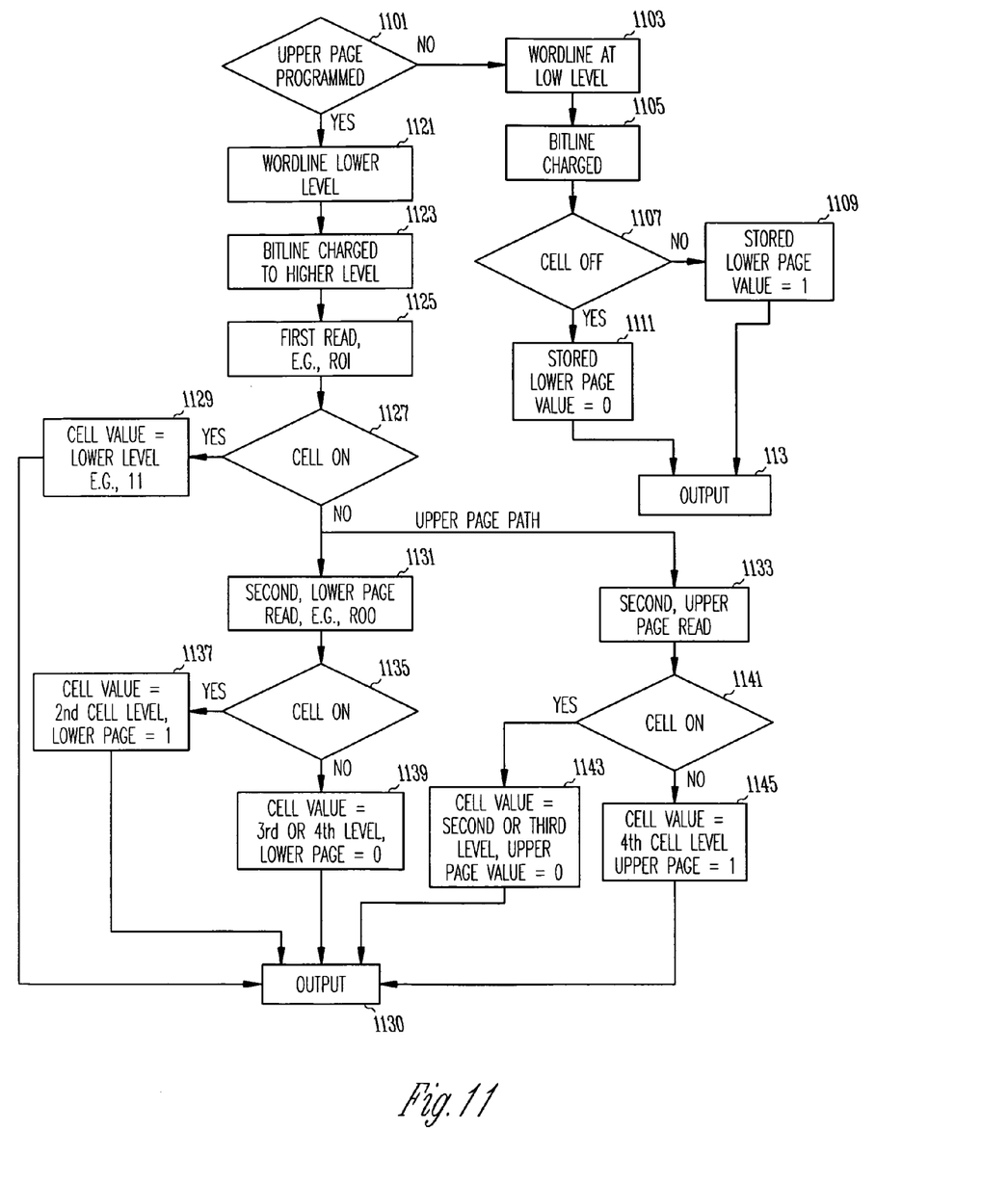
FIG. 11 is flow chart according to an embodiment.

FIG. 11 shows a flow chart 1100 illustrating steps for a read operation in a multilevel cell for non-volatile memory. At 1101, it is determined whether the upper page of the non-volatile memory is programmed. This can be done by setting a flag in control data for the memory. If the upper page is not programmed the method proceeds to 1103. At 1103, the wordline is set to a low level. In an example, the lower level is zero volts. At 1105, bitline is charged to a high level. This is the only charge required for the bitline during a read operation as described herein. At 1107, it is determined whether the cell is "off." This determination depends on whether the cell is conductive based on the wordline value provided to the control gate of a nonvolatile memory cell and the voltage on the bitline. If the bitline discharges to below a certain level during a develop time, e.g., between times T1 and T2 of FIGS. 10A and 10B, then it is known that the cell is "on" or conducting. Accordingly, the cell is not off and at 1109, it is known that the stored value in the lower page is equivalent to the lowest level. In the example, shown in FIGS. 9A and 9B, this corresponds to a lower page data value of "1." If the memory cell is "off", i.e., not conducting, then it is known that the stored value in the lower page is not the lowest value. In a binary storage of the lower page value for a cell, then it is known that the value is "0" at 1111. This is known because the upper page is not programmed as determined at 1101. Aspects 1109 and 1111 each move to output the sensed data at 1113. As a result, the data value in the lower page for a given cell is determined using a single bitline transition from low to high, which conserves energy and time.

At 1101, it can be determined that the upper page is programmed. At 1121, the wordline is set to a low level. At 1123, the bitline is charged from a low level to a high level. At 1125, a first read operation is performed. The first read operation determines whether the cell is programmed to one of the end levels. In one aspect, the end level is the lowest level, e.g., level 911 of FIG. 9B. If the cell is programmed to the end level, then the cell is on, 1127. At 1129 and as a result, the data in programmed in the cell corresponds to that cell level. Again referring to FIG. 9B, the data value can be "11." Thus, the data value is known for both the lower page and the upper page. At 1130, this value can then be output.

At 1127, the cell may remain "off." At 1131, a second lower page read is performed. At 1133, an upper page read is performed. The wordline transitions to high for each of these reads. The lower page read at 1131 determines whether memory cell is programmed at the second level that corresponds to the same data value in the lowest level. At 1133, a determination if the cell is "on" and the bitline discharges. If yes, then the memory cell is at the second level, 1137, which corresponds to the same lower page value as the first read, 1125. For example, the lower page data value is also "1." If the cell is "off" at 1135, then two of state levels for the lower page are eliminated and the data value in the lower page of the multilevel cell must be one of the two states that represent the other data value in the lower page, 1139. For example, the two lower levels 911 and 912 of the FIG. 9B embodiment represent the lower page value of "1." Here the data value in the lower page must be "0." At 1130, the lower page value can be output.

However, the upper page value in the multilevel memory cell is still not known. At 1127, a determination that the multilevel cell was not at the lowest value. Thus, the other value for the upper page that is the same as the value in the lowest level must know be determined. At 1133, a further, upper page read is performed. The bitline remains charged as the cell was off in 1123. The wordline transitions to a high level. At 1141, it is determined whether the cell is "on." If the cell is "on" then the stored upper page data value has a value, 1143, for example, at one of the second or third levels of FIG. 9B, which are the same upper page data value of "0." If the cell remains off, then at 1145 the upper page value is at the fourth level, which in the FIG. 9B embodiment is set at "1." The determined value at stored in the upper page can then be output, 1130.

While the embodiments described above with regard to FIGS. 9A, 9B, 10A, 10B and 11 refer to read operations, it is within the scope of the present invention to apply the methods, structures and systems to a verify operation. The methods, structures, and systems are set such that the bitline will remain charged after the first read operation if it is programmed to a higher level than the present read operation. Accordingly, a first known level in a multilevel cell is determined if the cell discharges the bitline in response to the wordline being low and the bitline being high.

Referring back to FIG. 10A and 10B, the bitline can be refreshed during the time T4 to time T4', which represents the time it takes to fully charge the wordline 1001 from low to high. This refresh time is insufficient to transition the bitline from a full low state to a full high state. Moreover, the time and available current would be insufficient to transition the signal 1007 back up to signal 1009. However, if the cell off signal 1009 lost some charge due to leakage, then it could be brought back to the fully charged level 1009. In an example, the refresh may only recharge less than 10% of the difference between 1007 and 1009 during such refresh operation.

A flash memory device, such as a NAND flash, has been described having an array of floating gate transistor memory cells arranged in a first and second addressable blocks. A voltage source to supply programming and/or verify voltages to control gates of the floating gate transistor memory cells is provided. A precharge circuit, such as a voltage source or current source, supplies a pre-charge to the bit line, selectively. Some precharging schemes precharge all selected bitlines globally during every sense, verify or read operation. This unnecessarily increases current consumption. At some stages of operation individual bitlines need not be precharged. Some examples when precharging is unnecessary include a selected bitline is program inhibited, for example, it is connected to a faulty NAND string or the bitline verify has already passed. In a further example, the value of the bitline is determined at a first sensing and a further sensing is not required. In the above circuit implementation, the feed latch information controls a PMOS transistor to control precharging. It will be understood that different circuit arrangements are within the scope of the present disclosure.

Referring back to FIG. 5, one example of program-inhibiting is now described. When a program command sequence begins in a block or page of the non-volatile memory, the node 510 is set to high by enabling, i.e., on or conducting, the transistors 527, 523 by controlling the set signal 529 and data latch signal 530. As a result the page buffers are set at a program-inhibited state with the power transistor 507 off. The program data is then loaded through data lines 541, 542 and controlled by the column select signal 545. This loading is performed sequentially, e.g., byte-by-byte or word-by-word. A program command is applied and a program pulse and program verify pulse is applied to the selected for program block or page. Node 510 stores a program data command, e.g., "0", or a program-inhibited command, e.g. "1." During the program operation, the program signal 513 is enabled and applied to transistor 511 to provide either the program or program inhibited data at node 510 to the selected bitline. During program verify, the program inhibited bitline is prevented from being precharged. After a verify sense operation, node 501 will be high for a program verify passed cell. Node 510 can be flipped from low to high by enabling data latch signal and the node 501 being high enables transistor 521. This establishes a program inhibit and prevents precharging of the respective bitline. As the program verify iteration continues, eventually most, if not all, nodes 510 in all page buffers will shift to high. Thus each verified bitline is program verified and is not precharged in subsequent iterations. Stated another way, as the number of program pulses and program verify pulses increase the number of bitline precharges decreases.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" may be used as the plain-English equivalents of the respective terms "comprising" and "wherein," respectively. Moreover, the terms "first," "second," and "third," etc. are used merely as labels, and are not intended to impose numerical requirements on their objects.

The invention claimed is:

1. A method of operating a memory device, the method comprising:
    biasing a wordline associated with a memory cell of the memory device to a first wordline level;
    biasing a bitline associated with the memory cell from a first bitline level to a second bitline level;
    performing a first sensing operation to determine data value stored in the memory cell;
    biasing the wordline from the first wordline level to a second wordline level; and
    performing a second sensing operation to determine data value stored in the memory cell if the data value is undetermined from the first sensing operation, wherein biasing the bitline from the first bitline level to the second bitline level is performed only one time when the first and second sensing operations are performed.

2. The method of claim 1, wherein biasing the bitline includes refreshing the bitline during biasing the wordline from the first wordline level to the second wordline level.

3. The method of claim 2, wherein refreshing the bitline includes supplying electrical energy less than a full charge to bias the bitline to the second bitline level.

4. The method of claim 1, wherein performing the second sensing operation includes selectively precharging the bitline.

5. The method of claim 1, wherein performing the second sensing operation includes selectively inhibiting precharging of bitlines associated with known cell levels, program inhibited bitlines, or verify-passed bitlines.

6. A method of operating a memory device, the method comprising:
    determining whether an upper page in a multilevel cell memory is programmed;
    biasing a wordline to a first wordline level;
    biasing a bitline from a first bitline level to a second bitline level only one time if the upper page is programmed;
    sensing the bitline to determine a value in a lower page of the multilevel cell memory;
    biasing the wordline from the first wordline level to a second wordline level if the upper page is programmed; and
    sensing the bitline to determine a value in the upper page.

7. The method of claim 6, wherein sensing the bitline includes selectively precharging the bitline.

8. The method of claim 6, wherein sensing the bitline includes selectively inhibiting precharging of bitlines associated with known cell levels, program inhibited bitlines, or verify-passed bitlines.

9. The method of claim 6, wherein biasing the bitline includes refreshing the bitline during biasing the wordline from the first wordline level to the second wordline level.

10. The method of claim 9, wherein refreshing the bitline includes supplying electrical energy less than a full charge to bias the bitline to the second bitline level.

11. The method of claim 6, wherein biasing the wordline from the first wordline level to the second wordline level is performed only one time.

12. A method of operating a memory device, the method comprising:
    biasing a wordline associated with a memory cell of the memory device to a first wordline level;
    biasing a bitline associated with the memory cell from a first bitline level to a second bitline level;
    performing a first sensing operation to determine data value stored in the memory cell;
    biasing the wordline from the first wordline level to a second wordline level; and
    performing a second sensing operation to determine data value stored in the memory cell if the data value is undetermined from the first sensing operation, wherein biasing the wordline from the first wordline level to the second wordline level is performed only one time when the first and second sensing operations are performed.

13. The method of claim 12, wherein biasing the bitline from the first bitline level to the second bitline level is performed only one time when the first and second sensing operations are performed.

14. The method of claim 12, wherein biasing the bitline includes refreshing the bitline during biasing the wordline from the first wordline level to the second wordline level.

15. The method of claim 14, wherein refreshing the bitline occurs during a first time period that is less than a second time period between biasing the bitline and a beginning of performing the first sensing operation.

16. A method of operating a memory device, the method comprising:
    biasing a wordline to a first wordline state;
    biasing a bitline from a first bitline state to a second bitline state;
    sensing a first level on the bitline;
    biasing the wordline to a second wordline state; and
    sensing a second level on the bitline, wherein biasing the bitline from the first bitline state to the second bitline state is performed only once when sensing the first and second levels are performed, wherein biasing the bitline includes refreshing the bitline during biasing the wordline to the second wordline state, and refreshing the bitline includes supplying electrical energy less than a full charge to bias the bitline from a discharged state to a fully charged state.

17. The method of claim 16, wherein refreshing the bitline occurs during a first time period that is less than a second time period between biasing the bitline and sensing the second level on the bitline.

18. The method of claim 16, wherein biasing the wordline to the second wordline state is performed only once when sensing the first and second levels are performed.

* * * * *